United States Patent
Moon et al.

(10) Patent No.: US 9,831,350 B2
(45) Date of Patent: Nov. 28, 2017

(54) THIN FILM TRANSISTOR AND METHOD OF MANUFACTURING THE SAME

(71) Applicant: Samsung Display CO., Ltd., Yongin-Si, Gyeonggi-do (KR)

(72) Inventors: Yeon-Keon Moon, Yongin-Si (KR); Je-Hun Lee, Yongin-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/886,214

(22) Filed: Oct. 19, 2015

(65) Prior Publication Data
US 2016/0204267 A1    Jul. 14, 2016

(30) Foreign Application Priority Data

Jan. 12, 2015 (KR) .................. 10-2015-0004151

(51) Int. Cl.
*H01L 29/786* (2006.01)
*H01L 29/423* (2006.01)
(Continued)

(52) U.S. Cl.
CPC .... *H01L 29/7869* (2013.01); *H01L 21/32139* (2013.01); *H01L 21/467* (2013.01);
(Continued)

(58) Field of Classification Search
CPC ..... H01L 29/7869; H01L 29/24; H01L 21/16; H01L 21/00; H01L 21/479;
(Continued)

(56) References Cited

U.S. PATENT DOCUMENTS

| 2005/0285251 A1* | 12/2005 | Lee | ......................... H01L 27/12 257/689 |
| 2006/0102907 A1* | 5/2006 | Lee | ..................... H01L 27/1214 257/72 |
| 2010/0051933 A1* | 3/2010 | Kim | ..................... H01L 29/7869 257/43 |
| 2011/0024755 A1* | 2/2011 | Korenari | ............. H01L 27/1214 257/59 |

(Continued)

FOREIGN PATENT DOCUMENTS

| KR | 10-2003-0058771 A | 7/2003 |
| KR | 10-2012-0014380 A | 2/2012 |
| KR | 10-2013-0086264 A | 7/2013 |

OTHER PUBLICATIONS

Chi-Sun Hwang, "Vertical Channel ZnO Thin-Film Transistors Using an Atomic Layer Deposition Method", IEEE Electron Device Letters, vol. 35, No. 3, Mar. 2014.

*Primary Examiner* — Allen Parker
*Assistant Examiner* — Long H Le
(74) *Attorney, Agent, or Firm* — H.C. Park & Associates, PLC

(57) ABSTRACT

Provided is a thin film transistor (TFT) that includes a first electrode on a substrate separated from a second electrode, an oxide semiconductor pattern on the second electrode including a channel region, a third electrode on the oxide semiconductor pattern, a first insulating layer on the substrate including the third electrode including first contact holes exposing a part of the first electrode, a part of the second electrode, and a part of the third electrode, a gate electrode on the first insulating layer and corresponding to a part of the oxide semiconductor pattern, a second insulating layer on the substrate including the gate electrode including a second contact hole corresponding to the first contact hole that exposes a part of the second electrode, and a pixel electrode on the second insulating layer electrically connected to the second electrode through the first contact hole and the second contact hole.

14 Claims, 14 Drawing Sheets

(51) Int. Cl.
*H01L 29/40* (2006.01)
*H01L 29/417* (2006.01)
*H01L 29/66* (2006.01)
*H01L 21/467* (2006.01)
*H01L 21/475* (2006.01)
*H01L 21/47* (2006.01)
*H01L 21/3213* (2006.01)
*H01L 29/24* (2006.01)

(52) U.S. Cl.
CPC ............ *H01L 29/24* (2013.01); *H01L 29/401* (2013.01); *H01L 29/41733* (2013.01); *H01L 29/42384* (2013.01); *H01L 29/66969* (2013.01)

(58) Field of Classification Search
CPC ............ H01L 21/32139; H01L 21/467; H01L 29/401; H01L 29/41733; H01L 29/42384; H01L 29/66969
See application file for complete search history.

(56) References Cited

U.S. PATENT DOCUMENTS

| | | | |
|---|---|---|---|
| 2011/0062992 A1* | 3/2011 | Okazaki | H01L 27/1214 326/102 |
| 2011/0127522 A1* | 6/2011 | Yamazaki | H01L 21/02472 257/43 |
| 2012/0091460 A1* | 4/2012 | Park | H01L 27/1225 257/59 |
| 2012/0211753 A1* | 8/2012 | Kim | H01L 27/1288 257/59 |
| 2013/0037783 A1* | 2/2013 | Lee | H01L 27/1255 257/40 |
| 2013/0221356 A1 | 8/2013 | Yamazaki et al. | |
| 2013/0285051 A1 | 10/2013 | Tanaka | |
| 2014/0138688 A1* | 5/2014 | Chang | H01L 27/1255 257/52 |
| 2015/0123134 A1* | 5/2015 | Wang | H01L 27/14649 257/72 |

* cited by examiner

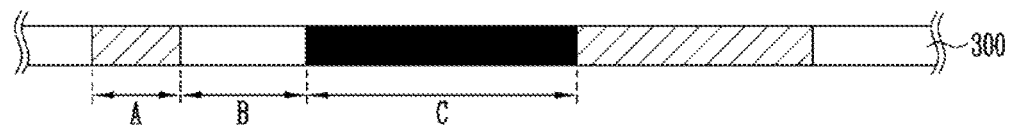
FIG. 5A
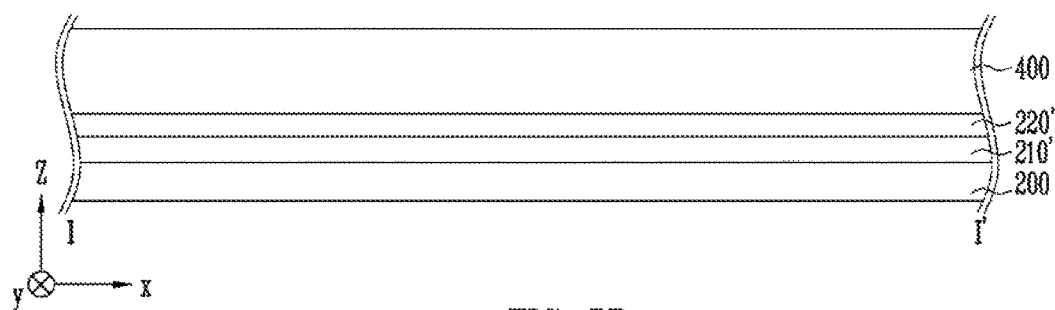
FIG. 5B
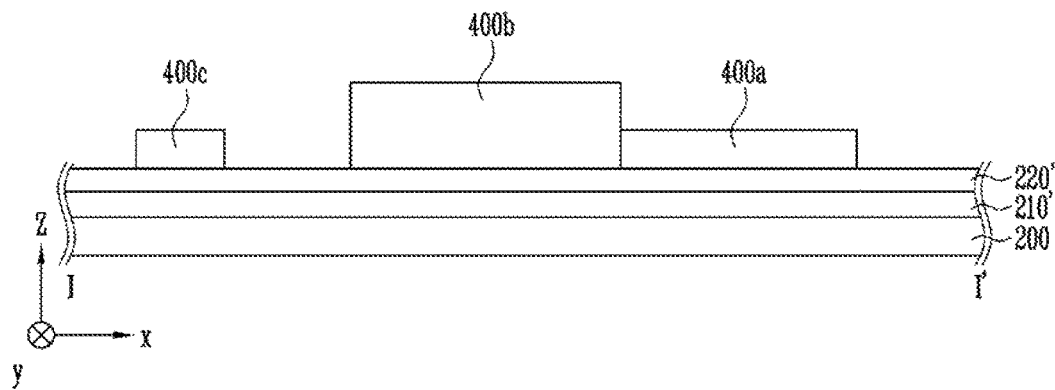
FIG. 5C
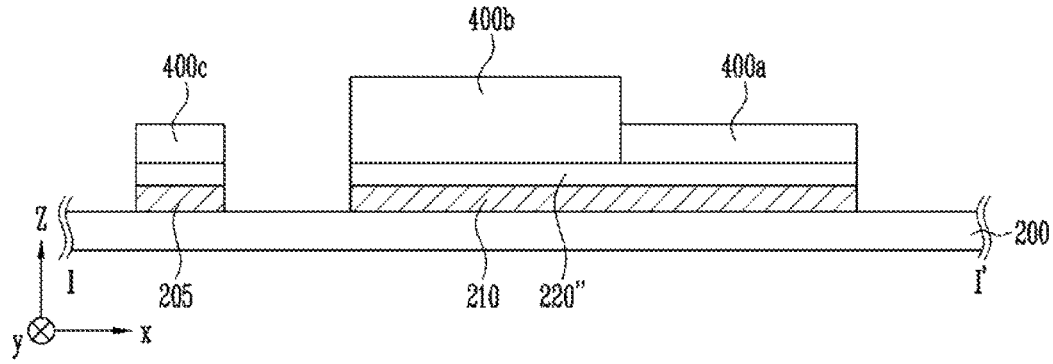

THIN FILM TRANSISTOR AND METHOD OF MANUFACTURING THE SAME

CLAIM OF PRIORITY

This application makes reference to, incorporates into this specification the entire contents of, and claims all benefits accruing under 35 U.S.C. §119 from an application earlier filed in the Korean Intellectual Property Office on Jan. 12, 2015 and there duly assigned Serial No. 10-2015-0004151.

BACKGROUND OF THE INVENTION

Field of the Invention

The present invention relates to a thin film transistor (TFT) and a method of manufacturing the same.

Description of the Related Art

A technology of forming a thin film transistor (TFT) by using a semiconductor thin film formed on a substrate having an insulating surface at a low temperature is spotlighted. The TFT is used for a display device represented by a TV. A silicon-based semiconductor material is well known as the semiconductor thin film that may be applied to the TFT. However, as another material, oxide semiconductor having higher electron mobility and a higher on/off current ratio than the silicon-based semiconductor material and having a lower price and higher uniformity than polycrystalline silicon is spotlighted.

On the other hand, in a highly-integrated high performance electronic apparatus, the TFT is required to be refined so that a vertical type TFT in which an occupied area of the TFT is minimized is suggested.

SUMMARY OF THE INVENTION

An embodiment of the present invention relates to a thin film transistor (TFT) capable of improving an electrical characteristic and improving a process margin and a method of manufacturing the same.

A TFT according to an embodiment of the present invention includes a first electrode positioned on a substrate and a second electrode separated from the first electrode, an oxide semiconductor pattern positioned on the second electrode and including channel region, a third electrode positioned on the oxide semiconductor pattern, a first insulating layer positioned on the substrate including the third electrode and including first contact holes exposing a part of the first electrode, a part of the second electrode, and a part of the third electrode, a gate electrode positioned on the first insulating layer and corresponding to a part of the oxide semiconductor pattern, a second insulating layer positioned on the substrate including the gate electrode and including a second contact hole corresponding to the first contact hole that exposes a part of the second electrode, and a pixel electrode positioned on the second insulating layer and electrically connected to the second electrode through the first contact hole and the second contact hole.

The second electrode is positioned under the oxide semiconductor pattern and the third electrode is positioned on the oxide semiconductor pattern to form a stacked structure.

The second electrode and the third electrode include different metal materials from each other.

The oxide semiconductor pattern includes indium-tin-zinc-oxide (ITZO).

The TFT further includes a connection pattern positioned on the first insulating layer to electrically connect the first electrode and the third electrode through the first contact hole.

The connection pattern includes the same material as the gate electrode in the same layer as the gate electrode.

The first electrode comprises the same material as the second electrode in the same layer as the second electrode.

A method of manufacturing a TFT according to an embodiment of the present invention includes forming a first electrode and a second electrode separated from the first electrode on a substrate, forming an oxide semiconductor pattern including a channel region on the second electrode, forming a third electrode that overlaps a part of the second electrode on the oxide semiconductor pattern, forming a first insulating layer including first contact holes exposing a part of the first electrode, a part of the second electrode, and a part of the third electrode on the substrate including the third electrode, forming a connection pattern for electrically connecting the first electrode and the third electrode through the first contact hole at the same time when a gate electrode corresponding to a part of the oxide semiconductor pattern is formed on the first insulating layer, forming a second insulating layer including a second contact hole corresponding to the first contact hole that exposes a part of the second electrode on the gate electrode, and forming a pixel electrode electrically connected to the second electrode through the first contact hole and the second contact hole on the second insulating layer.

The second electrode is positioned under the oxide semiconductor pattern and the third electrode is positioned on the oxide semiconductor pattern to form a stacked structure.

The second electrode and the third electrode include different metal materials from each other.

The channel region is determined by a region caused by offset between the third electrode and the oxide semiconductor pattern and a thickness of the oxide semiconductor pattern.

The oxide semiconductor pattern includes indium-tin-zinc-oxide (ITZO).

A method of manufacturing a TFT includes subsequently forming a conductive layer and an oxide semiconductor layer on a substrate, after depositing a photoresist layer on the oxide semiconductor layer, arranging a mask on the photoresist layer to form a first photoresist layer pattern and a second photoresist layer pattern thicker than the first photoresist layer pattern, etching exposed parts of the oxide semiconductor layer and the conductive layer by using the first photoresist layer pattern and the second photoresist layer pattern as masks to form an oxide semiconductor pattern, a first electrode, and a second electrode separated from the first electrode by a uniform distance, removing the first photoresist layer pattern to expose the oxide semiconductor pattern to the outside and forming the second photoresist layer pattern to a third photoresist layer pattern having a small thickness, removing the exposed oxide semiconductor pattern and exposing the first electrode and the second electrode positioned under the oxide semiconductor pattern to the outside, removing the third photoresist layer pattern and exposing the second electrode positioned under the third photoresist layer pattern and the oxide semiconductor pattern including a channel region to the outside, forming a third electrode positioned on the oxide semiconductor pattern and overlapping a part of the second electrode, forming a first insulating layer including first contact holes exposing a part of the first electrode, a part of the second electrode, and a part of the third electrode on the third electrode, forming a connection pattern for electrically connecting the first electrode and the third electrode through the first contact hole at the same time when a gate electrode corresponding to a part of the oxide semiconductor pattern is formed on the first insulating layer, forming a second insulating layer including a second contact hole corresponding to the first contact hole that exposes a part of the second electrode on the gate electrode, and forming a pixel electrode electrically connected to the second electrode through the first contact hole and the second contact hole on the second insulating layer.

The second electrode is positioned under the oxide semiconductor pattern and the third electrode is positioned on the oxide semiconductor pattern to form a stacked structure.

The second electrode and the third electrode include different metal materials from each other.

The channel region is determined by a region caused by offset between the third electrode and the oxide semiconductor pattern and a thickness of the oxide semiconductor pattern.

The oxide semiconductor pattern includes ITZO.

A TFT according to another embodiment of the present invention includes a source electrode positioned on a substrate, an oxide semiconductor pattern positioned on the source electrode and including a channel region, a drain electrode positioned on the oxide semiconductor pattern, an insulating layer positioned on the substrate including the drain electrode and including contact holes exposing a pan of the source electrode and a part of the drain electrode and a gate electrode positioned on the insulating layer and corresponding to a part of the oxide semiconductor pattern, wherein the source electrode is positioned under the oxide semiconductor pattern and the drain electrode is positioned on the oxide semiconductor pattern to form a stacked structure.

A method of manufacturing a TFT according to another embodiment of the present invention includes forming a source electrode on a substrate, forming a source electrode on a substrate, forming an oxide semiconductor pattern including a channel region on the source electrode, forming a drain electrode that overlaps a part of the source electrode on the oxide semiconductor pattern, forming an insulating layer including contact holes exposing a part of the source electrode and a part of the drain electrode on the substrate including the drain electrode, and forming a gate electrode corresponding to a part of the oxide semiconductor pattern on the insulating layer, wherein the source electrode is positioned under the oxide semiconductor pattern and the drain electrode is positioned on the oxide semiconductor pattern to form a stacked structure.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE INVENTION

Figure 1:
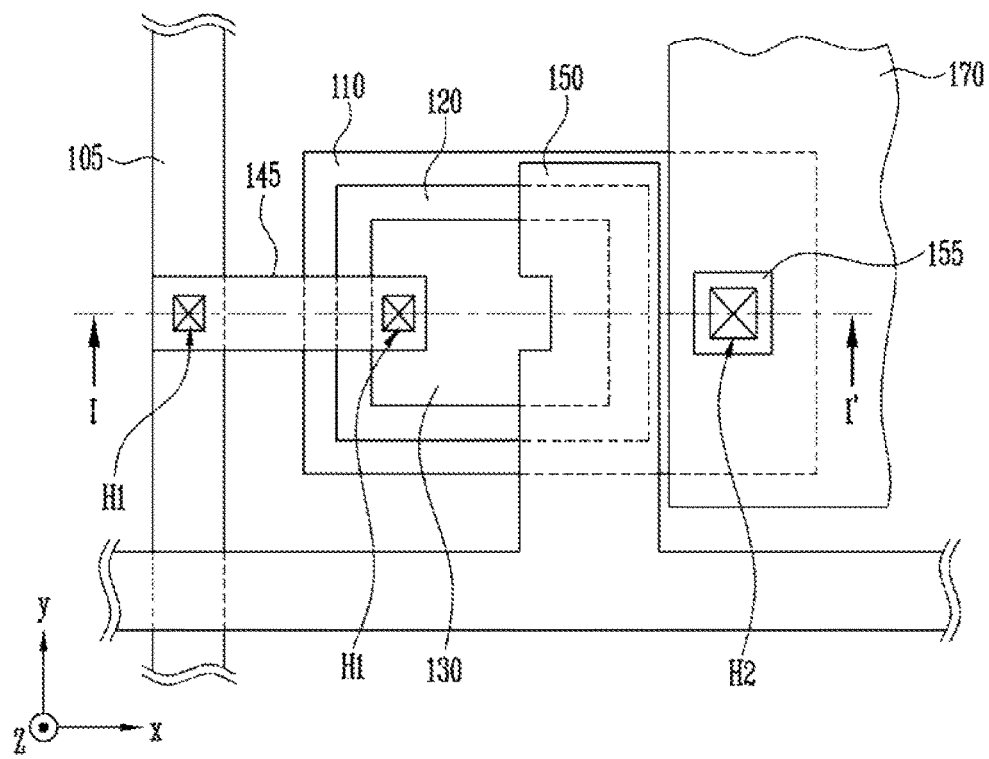
FIG. 1 is a plan view illustrating a thin film transistor (TFT) according to an embodiment of the present invention.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

Like reference numerals refer to like elements throughout. In the drawing figures, dimensions may be exaggerated for clarity of illustration.

It will also be understood that when an element is referred to as being "on" another element, it can be directly on the other element, or intervening elements may also be present.

Figure 2:
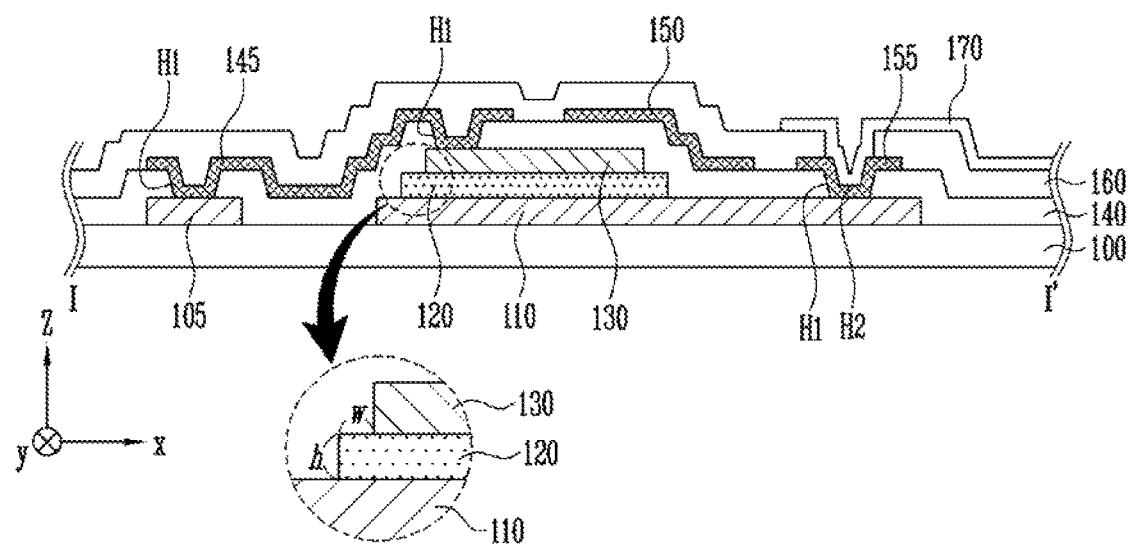
FIG. 2 is a cross-sectional view taken along the line I-I' of FIG. 1.

FIG. 1 is a plan view illustrating a thin film transistor (TFT) according to an embodiment of the present invention. FIG. 2 is a cross-sectional view taken along the line I-I' of FIG. 1.

Referring to FIGS. 1 and 2, the TFT according to the embodiment of the present invention includes a bar-shaped first electrode 105 that extends in a vertical direction on a substrate 100, a second electrode 110 separated from the bar-shaped first electrode 105 by a uniform distance, an oxide semiconductor pattern 120 formed on the second electrode 110, a third electrode 130 formed on the oxide semiconductor pattern 120, a first insulating layer 140 formed on the third electrode 130, first and second connection patterns 145 and 155, a gate electrode 150 formed on the first insulating layer 140 (not shown in FIG. 2), a second insulating layer 160 formed on the first and second connection patterns 145 and 155, the gate electrode 150, and a pixel electrode 170 formed on the second insulating layer 160 to be electrically connected to the second electrode 110.

The TFT is vertical type.

The substrate 100 as a material for forming an element may have high mechanical strength or size stability. The material of the substrate 100 may be, for example, a glass plate, a metal plate, a ceramic plate, or plastic (polycarbonate resin, polyester resin, epoxy resin, silicon resin, or fluoride resin). However, the present invention is not limited thereto.

The second electrode 110 functions as one side of each of a source electrode and a drain electrode of the TFT. The bar-shaped first electrode 105 separated from the second electrode 110 by the uniform distance provides an electrical signal provided from the outside to the third electrode 130 through the first connection pattern 145.

The first electrode 105 and the second electrode 110 may be formed of an aluminum (Al)-based metal such as Al and an Al alloy, a silver (Ag)-based metal such as Ag and an Ag alloy, or a molybdenum (Mo)-based metal such as Mo and a Mo alloy.

The third electrode 130 functions as the other side of each of the source electrode and the drain electrode of the TFT and may be formed of a conductive material different from the second electrode 110. For example, the third electrode 130 may be formed of a copper (Cu)-based metal including Cu.

The oxide semiconductor pattern 120 may include an oxide semiconductor material. The oxide semiconductor material as a metal oxide semiconductor may be formed of oxides of metals such as zinc (Zn), indium (In), gallium (Ga), tin (Sn), and titanium (Ti) or combinations of the metals such as Zn, In, Ga, Sn, and Ti and the oxides of the metals. For example, the oxide semiconductor material may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-tin-zinc oxide (ITZO).

According to the embodiment of the present invention, the oxide semiconductor material may be formed of the ITZO.

A thickness h of the oxide semiconductor pattern 120 may be no less than 100 Å.

The oxide semiconductor pattern 120 has effective mobility of charges larger than that of hydrogenated amorphous silicon about 2 to 100 times and has an on/off current ratio of a value of $10^5$ to $10^8$ so that the oxide semiconductor pattern 120 may have a high semiconductor characteristic. In addition, although the oxide semiconductor pattern 120 is amorphous, since the oxide semiconductor pattern 120 has the high effective mobility of charges and conventional processes of manufacturing amorphous silicon may be applied almost as it is, it may be advantageous to the manufacturing processes.

The second and third electrodes 110 and 130 are respectively formed under and on the oxide semiconductor pattern 120 and form a stacked structure with steps formed by edges of each stacked layer together with the oxide semiconductor pattern 120. For example, the oxide semiconductor pattern 120 is formed on the second electrode 110, except regions of edges of the second electrode 110, forming steps of the stacked structure. Similarly, the third electrode 130 is formed on the oxide semiconductor pattern 120, except regions of edges of the oxide semiconductor pattern 120, forming another steps of the stacked structure.

As the step structure in which the oxide semiconductor pattern 120 is positioned in the center and the second electrode 110 and the third electrode 130 are respectively positioned under and on the oxide semiconductor pattern 120 is formed, a short channel region may be formed in a vertical direction. Therefore, the channel region is formed over the oxide semiconductor pattern 120 so that more current may be flown.

The channel region of the TFT according to the embodiment of the present invention may be determined by the thickness h of the oxide semiconductor pattern 120.

In addition, a current path is formed in a region w caused by offset between side surfaces of the oxide semiconductor pattern 120 and the third electrode 130 having the stacked structure so that the region w caused by offset may extend to the channel region. Since a minimum channel region required for stability may be secured in the TFT due to the region w caused by offset, a process margin for the channel region may be improved.

Therefore, in the TFT according to the embodiment of the present invention, the channel region extends to the region w caused by offset of the oxide semiconductor pattern 120 and the third electrode 130 as well as the thickness h of the oxide semiconductor pattern 120 so that the electrical characteristic of the TFT may be improved. The region w caused by offset means a distance between the side surface of the third electrode 130 and the side surface of the oxide semiconductor pattern 120. The distance between the side surface of the third electrode 130 and the side surface of the oxide semiconductor pattern 120 may be determined in accordance with a degree to which the third electrode 130 is curved inward from the side surface of the oxide semiconductor pattern 120 on the oxide semiconductor pattern 120.

In addition, a channel characteristic of the TFT may be independently controlled through the thickness h of the oxide semiconductor pattern 120 and the region w caused by offset.

At this time, the region w caused by offset of the oxide semiconductor pattern 120 and the third electrode 130 may be about 100 Å long.

The first insulating layer 140 is formed on the entire surface of the substrate 100 on which the third electrode 130 is formed. The first insulating layer 140 may be formed of an inorganic material formed of silicon nitride or silicon oxide, an organic material having a high planarizing characteristic and high photoresistivity, or a low dielectric insulating material such as a-Si:C:O and a-Si:O:F, which is formed by plasma enhanced chemical vapor deposition (PECVD). In addition, although the first insulating layer 140 is not shown, the first insulating layer 140 may have a double-layered structure of a lower inorganic layer and an upper organic layer.

The first insulating layer 140 includes a plurality of first contact holes H that expose a part of the bar-shaped first electrode 105, a part of the third electrode 130, and a part of the second electrode 110.

The gate electrode 150 forms a vertical type TFT together with the second and third electrodes 110 and 130 and the oxide semiconductor pattern 120. The gate electrode 150 may be formed of a metal such as Al, Ag, Cu, Mo, chrome (Cr), tantalum (Ta), and Ti or an alloy of the above metals.

The gate electrode 150 may be formed on the side surface of the oxide semiconductor pattern 120 with the first insulating layer 140 interposed.

The first connection pattern 145 is formed on the same layer and of the same material as the gate electrode 150 and electrically connects the first electrode 105 and the third electrode 130 through the first contact holes H1.

The second connection pattern 155 is formed on the same layer and of the same material as the gate electrode 150 like the first connection pattern 145, is formed on the second electrode 110 exposed to the outside through the first contact hole H1, and electrically connects the pixel electrode 170 and the second electrode 110.

The second insulating layer 160 is positioned on the substrate 100 on which the first and second connection patterns 145 and 155, the gate electrode 150 are formed and includes a second contact hole H2 that exposes a part of the second connection pattern 155 to the outside.

The pixel electrode 170 may be formed on the substrate 100 on which the second insulating layer 160 is formed. The pixel electrode 170 is positioned on the second connection pattern 155 exposed to the outside by the second contact hole H2 and is electrically connected to the second electrode 110 positioned under the second connection pattern 155.

An electrical signal provided to the first electrode 105 is supplied to the third electrode 130 through the first connection pattern 145, is provided to the second electrode 110 by the channel region of the oxide semiconductor pattern 120, and may be finally provided to the pixel electrode 170 through the second connection pattern 155.

As described above, in the TFT according to the embodiment of the present invention, the channel region may be determined by the thickness h of the oxide semiconductor pattern 120 and region w caused by offset. Therefore, since the channel characteristic may be easily controlled by independently controlling the thickness h of the oxide semiconductor pattern 120 and region w caused by offset, the electrical characteristic of the TFT according to the embodiment of the present invention may be improved.

Hereinafter, a method of manufacturing the TFT having the above-described structure according to the embodiment of the present invention will be described.

Figure 3A:
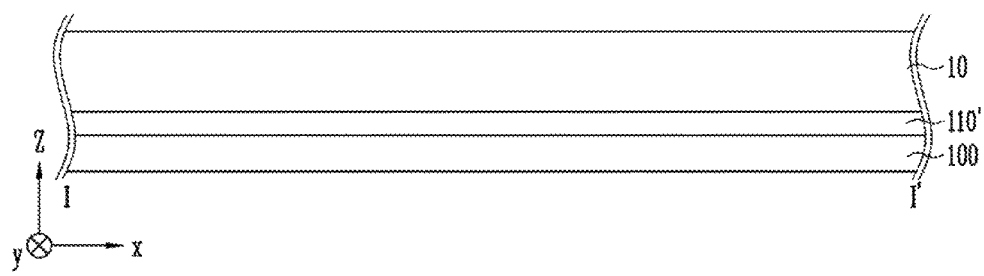
FIGS. 3A to 3O are cross-sectional views sequentially illustrating a method of manufacturing the TFT of FIG. 2.
Figure 3B:
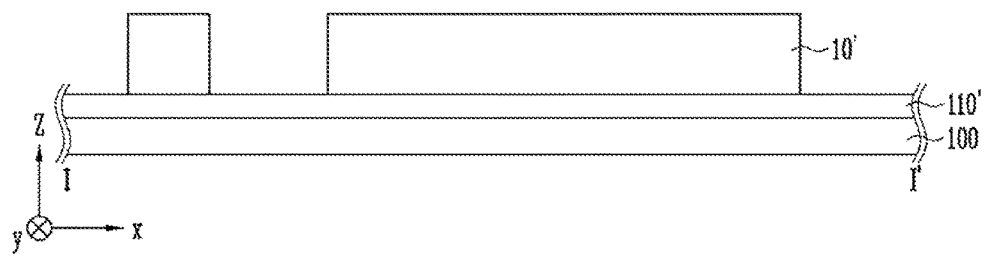
Figure 3C:
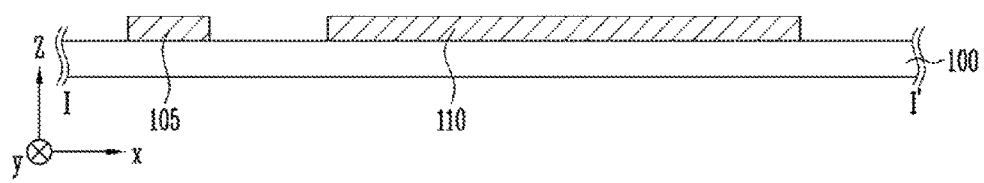
Figure 3D:
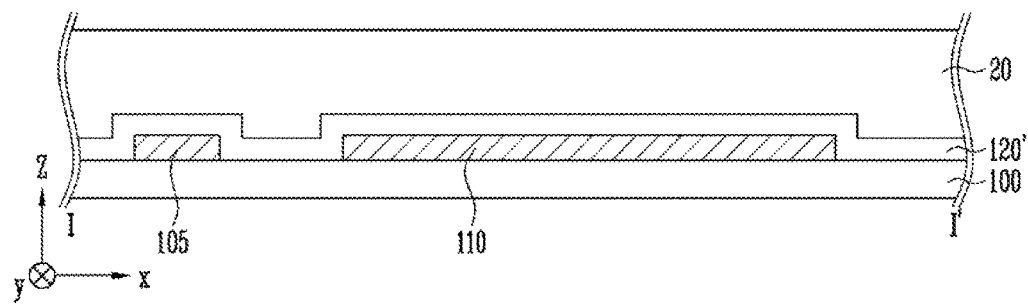
Figure 3E:
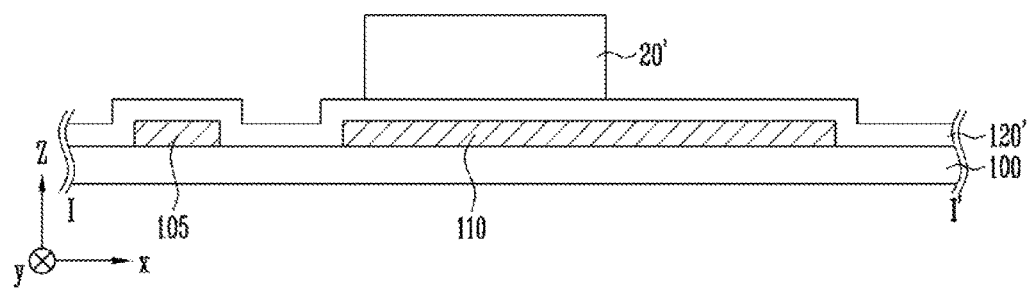
Figure 3F:
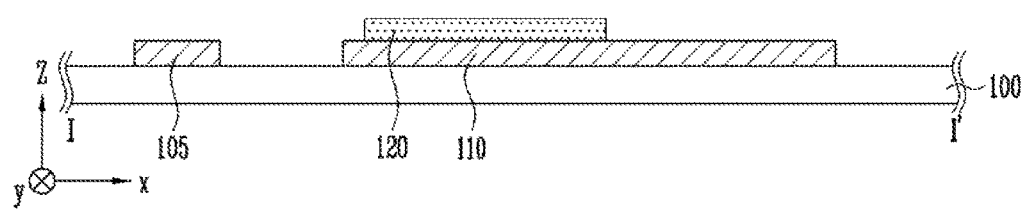
Figure 3G:
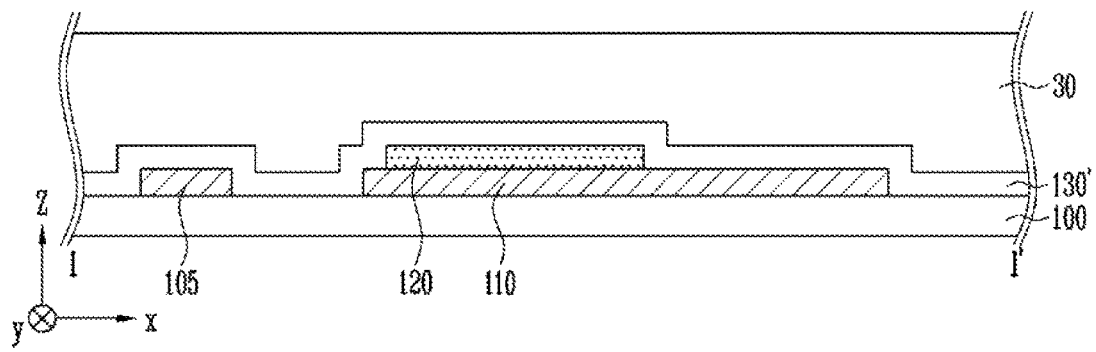
Figure 3H:
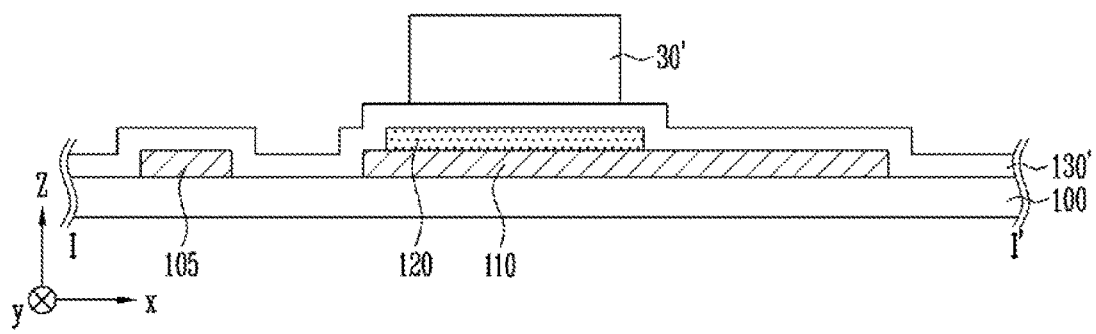
Figure 3I:
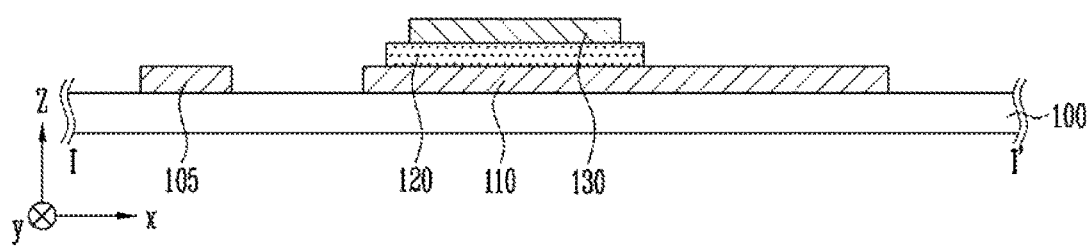
Figure 3J:
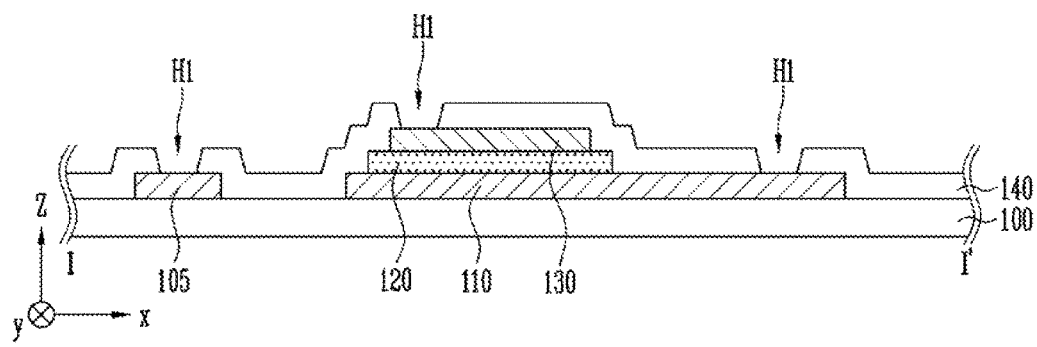
Figure 3K:
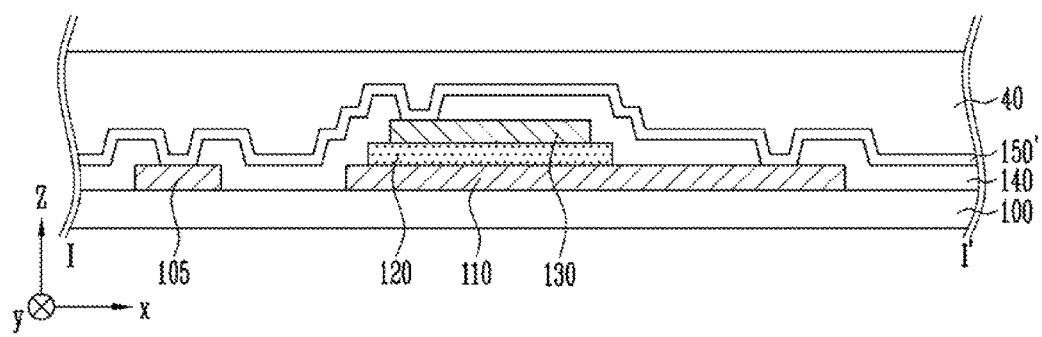
Figure 3L:
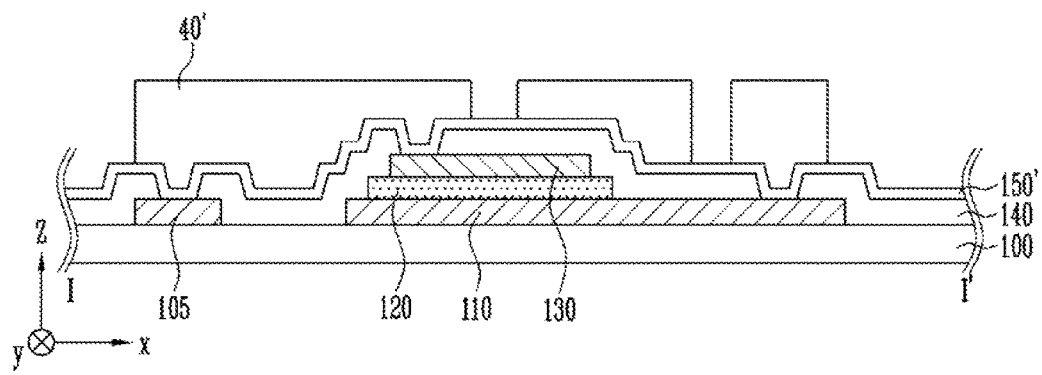
Figure 3M:
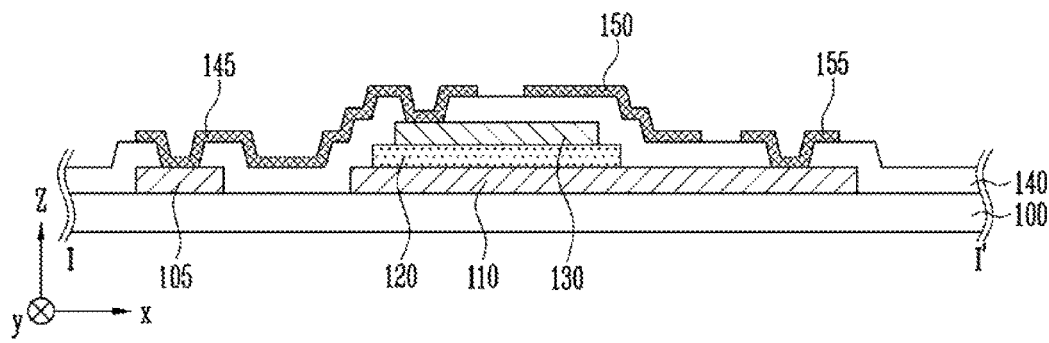
Figure 3N:
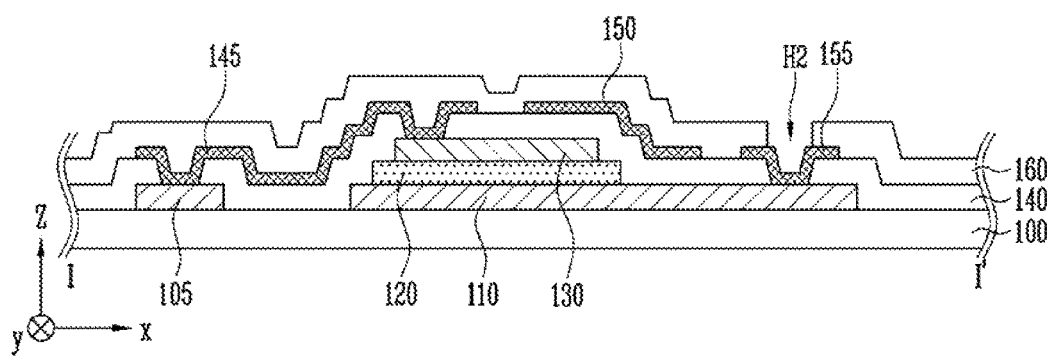
Figure 3O:
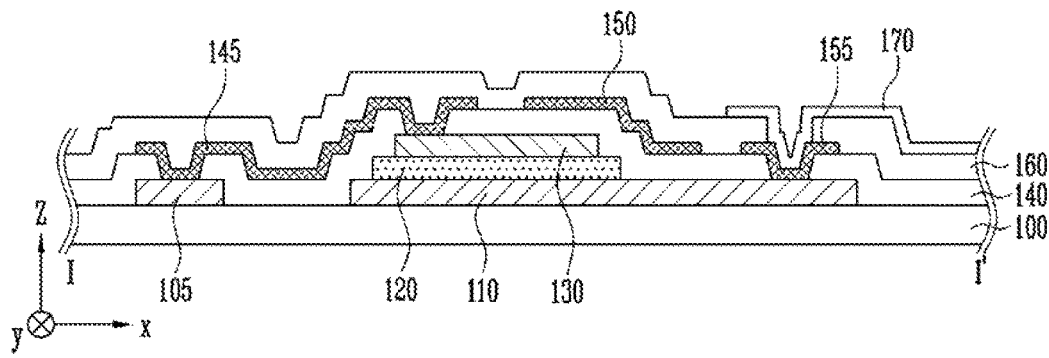

FIGS. 3A to 3O are cross-sectional views sequentially illustrating a method of manufacturing the TFT of FIG. 2. FIGS. 4A to 4F are plan views illustrating the method of manufacturing the TFT of FIG. 2.

Referring to FIG. 3A, a first conductive layer 110' is formed on the substrate 100. A first photoresist layer 10 is formed on the first conductive layer 110'. The first conductive layer 110' may be formed of the Al-based metal such as Al and the Al alloy, the Ag-based metal such as Ag and the Ag alloy, or the Mo-based metal such as Mo and the Mo alloy.

After arranging a mask (not shown) over the first photoresist layer 10, a series of unit processes such as exposure are performed so that a photoresist layer pattern 10' is formed as illustrated in FIG. 3B. On the substrate 100, the photoresist layer pattern 10' is not formed in a part of the first conductive layer 110' so that the part of the first conductive layer 110' is exposed to the outside.

Figure 4A:
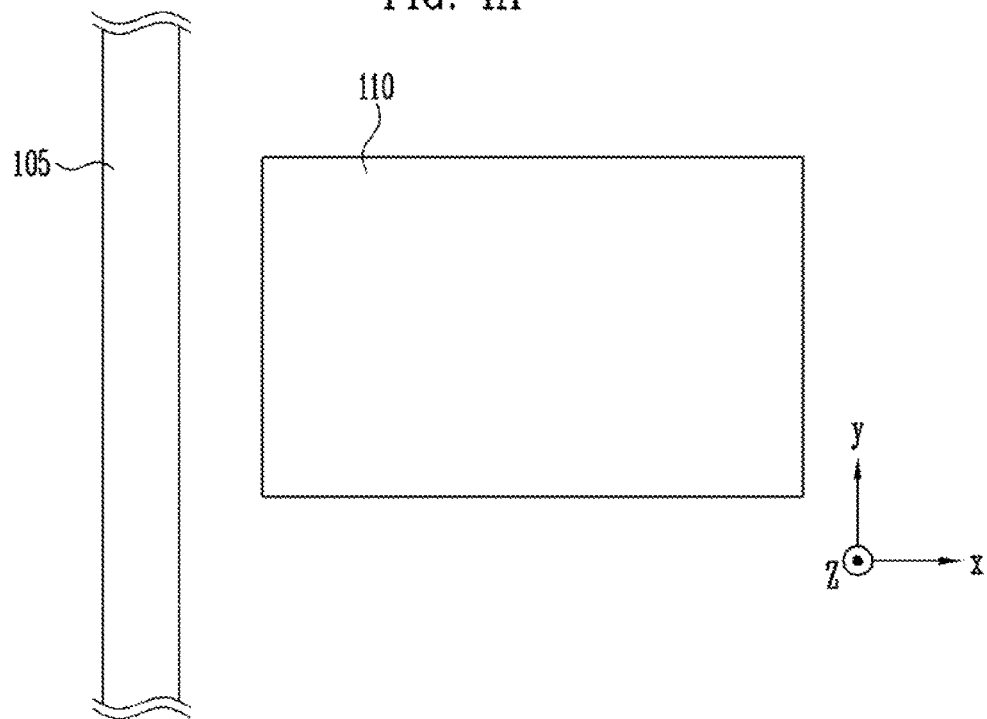
FIGS. 4A to 4F are plan views illustrating the method of manufacturing the TFT of FIG. 2.

Then, referring to FIGS. 3C and 4A, the first conductive layer 110' exposed to the outside is removed by using the photoresist layer pattern 10' as an etching mask so that the bar-shaped first electrode 105 and the second electrode 110 separated from the first electrode 105 by a uniform distance are formed. Then, the photoresist layer pattern (10' of FIG. 3B) is removed through a strip process.

Referring to FIG. 3D, an oxide semiconductor material 120' is deposited on an entire surface of the substrate 100 on which the second electrode 110 is formed. A second photoresist layer 20 is formed on the entire surface of the substrate 100 on which the oxide semiconductor material 120' is formed.

The oxide semiconductor material 120' as a metal oxide semiconductor may be formed of oxides of metals such as Zn, In, Ga, Sn, and Ti or combinations of the metals such as Zn, In, Ga, Sn, and Ti and the oxides of the metals. For example, the oxide semiconductor material may include at least one of ZnO, ZTO, ZIO, InO, TiO, IGZO, and ITZO.

After arranging a mask (not shown) over the second photoresist layer 20, a series of unit processes such as exposure are performed so that a photoresist layer pattern 20' is formed as illustrated in FIG. 3E. On the substrate 100, the photoresist layer pattern 20' is not formed in a part of the oxide semiconductor material 120' so that the part of the oxide semiconductor material 120' is exposed to the outside.

Figure 4B:
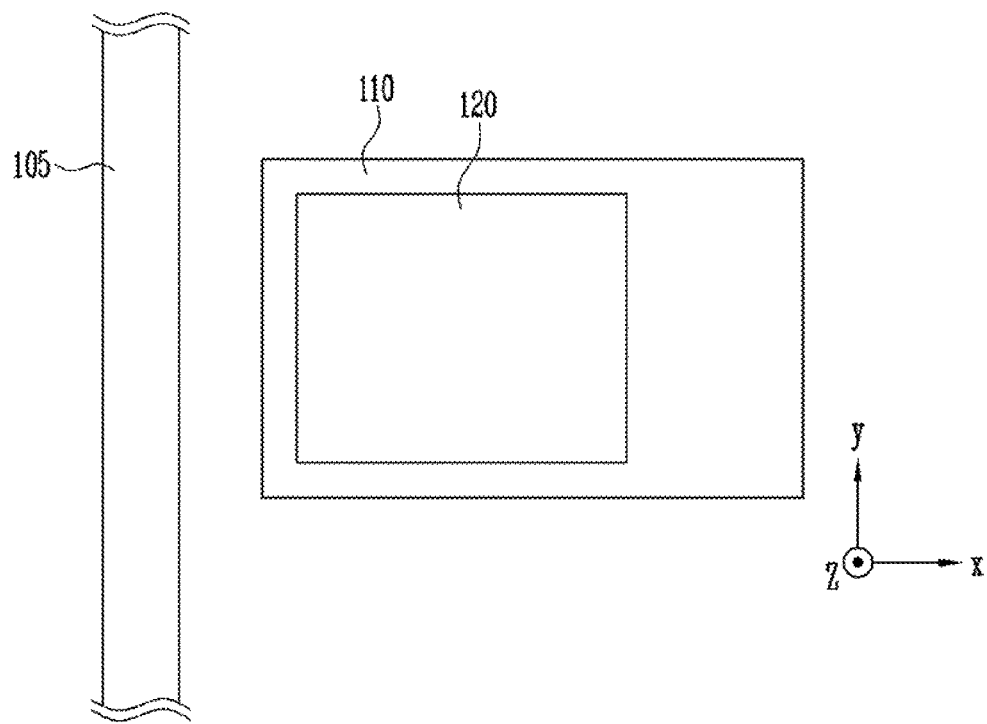

Referring to FIGS. 3F and 4B, the oxide semiconductor material 120' exposed to the outside is removed by using the photoresist layer pattern 20' as an etching mask so that the oxide semiconductor pattern 120 is formed. At this time, an etchant in an etching process etches only a metal oxide semiconductor material and does not affect the first electrode 105 and the second electrode 110 that are positioned under the oxide semiconductor material 120'.

Referring to FIG. 3G, a second conductive layer 130' is formed on the substrate 100 on which the oxide semiconductor pattern 120 is formed. A third photoresist layer 30 is formed on the second conductive layer 130'. The second conductive layer 130' as a conductive material different from the second electrode 110 may be formed of a Cu-based metal including Cu.

After arranging a mask (not shown) over the third photoresist layer 30, a series of unit processes such as exposure are performed so that a photoresist layer pattern 30' is formed as illustrated in FIG. 3H. On the substrate 100, the photoresist layer pattern 30' is not formed in a part of the second conductive layer 130' so that the part of the second conductive layer 130' is exposed to the outside.

Figure 4C:
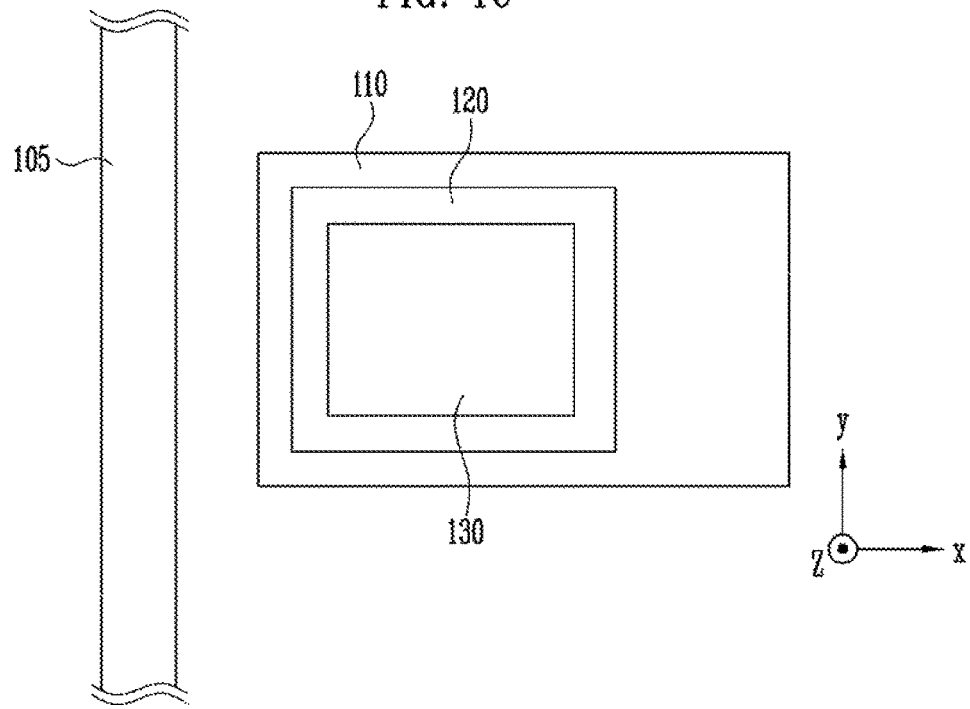

Referring to FIGS. 3I and 4C, the second conductive layer 130' exposed to the outside is removed by using the photoresist layer pattern 30' as an etching mask so that the third electrode 130 that overlaps the oxide semiconductor pattern 120 is formed. At this time, an etching solution in an etching process etches only the second conductive layer 130' formed of a Cu-based metal and does not affect the oxide semiconductor pattern 120 positioned under the second conductive layer 130'.

At this time, the second electrode 110, the oxide semiconductor pattern 120, and the third electrode 130 that are sequentially formed on the substrate 100 have a step type stacked structure. The oxide semiconductor pattern 120 is positioned in the center and the second electrode 110 and the third electrode 130 are positioned under and on the oxide semiconductor pattern 120 so that the channel region longitudinal in a vertical direction is formed.

In addition, a current path is formed in a region caused by offset between the side surfaces of the oxide semiconductor pattern 120 and the third electrode 130 having the step type stacked structure.

Figure 4D:
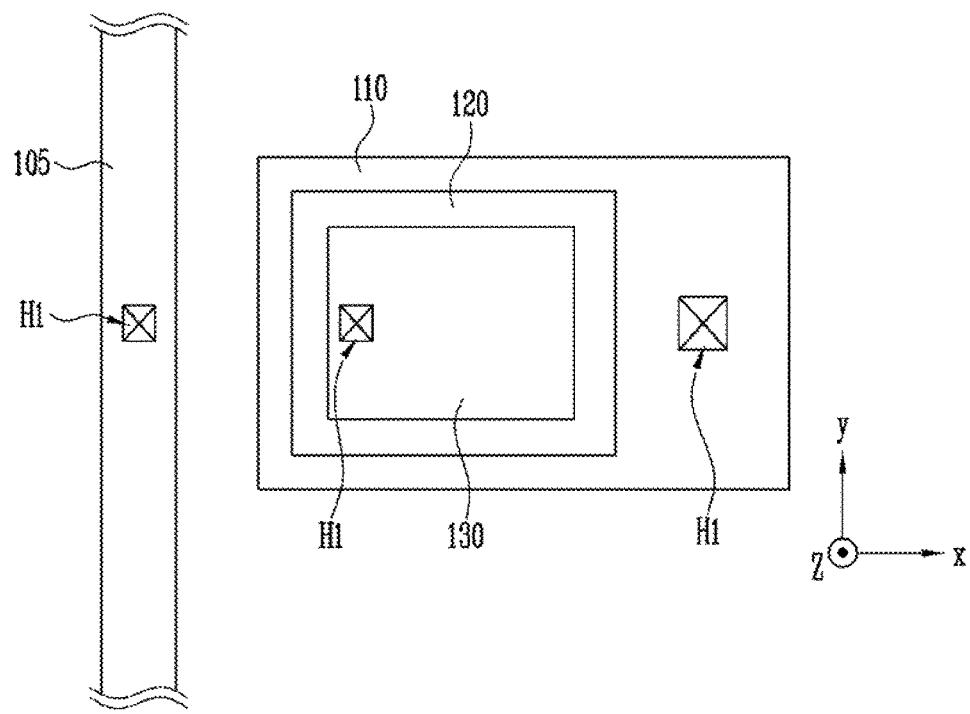

Referring to FIGS. 3J and 4D, the first insulating layer 140 including the plurality of first contact holes H1 that expose the part of the first electrode 105, the part of the second electrode 110, and the part of the third electrode 130 to the outside is formed on the substrate 100 on which the third electrode 130 is formed.

Then, referring to FIG. 3K, a third conductive layer 150' is formed on the substrate 100 on which the first insulating layer 140 is formed. A fourth photoresist layer 40 is formed on the entire surface of the substrate 100 on which the third conductive layer 150' is formed. The third conductive layer 150' may be formed of a metal such as Al, Ag, Cu, Mo, Cr, Ta, and Ti or an alloy of the above metals.

After arranging a mask (not shown) over the fourth photoresist layer 40, a series of unit processes such as exposure are performed so that a photoresist layer pattern 40' is formed as illustrated in FIG. 3L. On the substrate 100, the photoresist layer pattern 40' is not formed in a part of the third conductive layer 150' so that the part of the third conductive layer 150' is exposed to the outside.

Figure 4E:
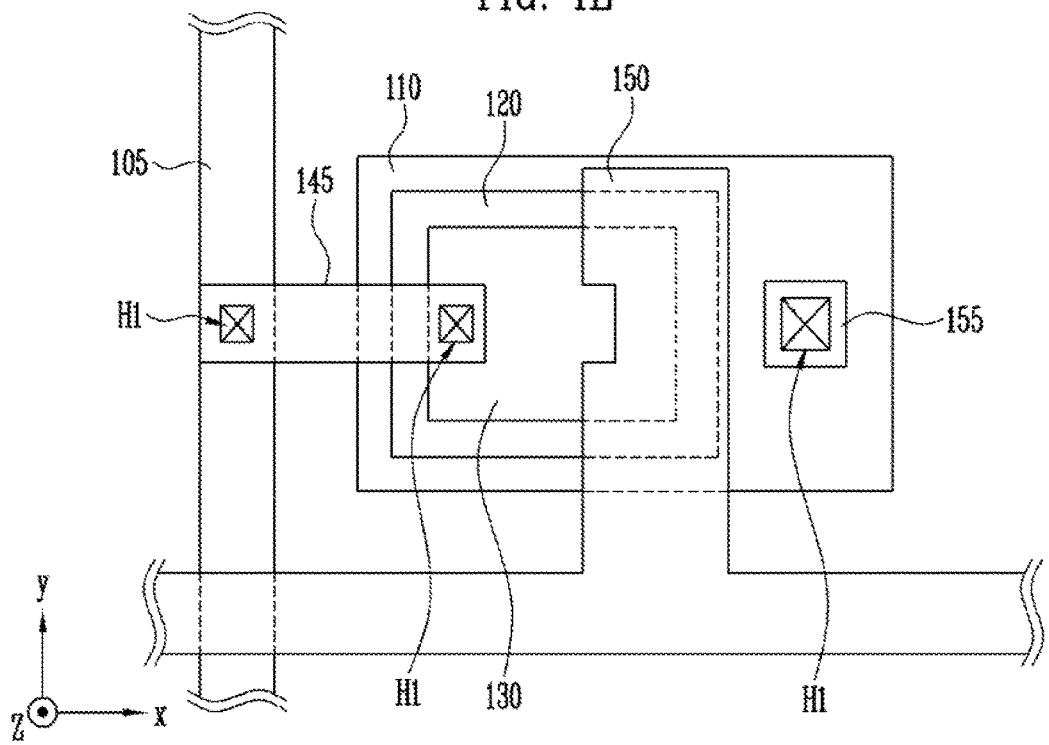

Referring to FIGS. 3M and 4E, the third conductive layer 150' exposed to the outside is removed by using the photoresist layer pattern 40' as an etching mask so that the first connection pattern 145 for electrically connecting the first electrode 105 and the third electrode 130 through the first contact holes (H1 of FIG. 3J) and the gate electrode 150 positioned on the side surface of and the oxide semiconductor pattern 120 are formed.

In addition, the second connection pattern 155 connected to a part of the second electrode 110 through the first contact hole H1 is formed on the first insulating layer 140.

The first connection pattern 145 transmits the electrical signal provided from the outside to the first electrode 105 to the second electrode 130. The electrical signal transmitted to the second electrode 130 may be provided to the second electrode 110 formed under the oxide semiconductor pattern 120 by the channel region of the oxide semiconductor pattern 120 formed under the second electrode 130.

Referring to FIG. 3N, the second insulating layer 160 including the second contact hole H2 that exposes a part of the second connection pattern 155 to the outside is formed on the substrate 100 on which the first and second connection patterns 145 and 155 and the gate electrode 150 are formed.

Figure 4F:
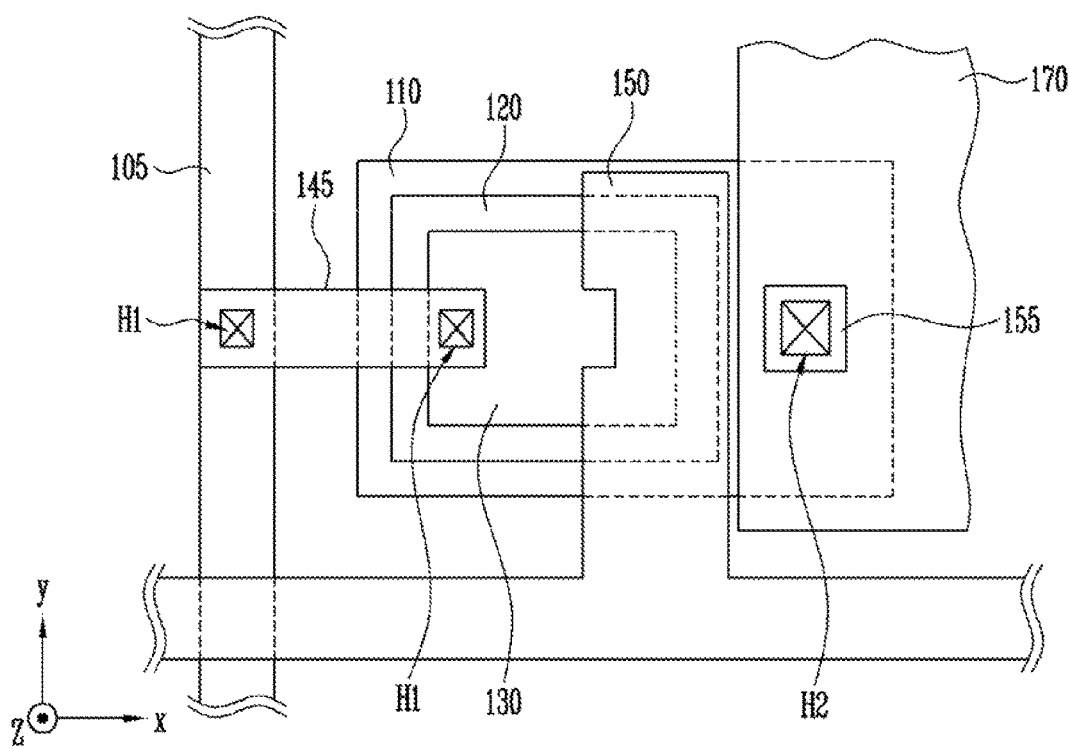

Continuously, referring to FIGS. 3O and 4F, the pixel electrode 170 connected to the second connection pattern 155 through the second contact hole H2 is formed on the substrate 100 on which the second insulating layer 160 is formed. The pixel electrode 170 may be formed of a transparent conductive material. The transparent conductive material may include an oxide-based transparent conductive layer such as indium tin oxide (ITO), indium zinc oxide (IZO), zinc oxide (ZnO), and $In_2O_3$.

The electrical signal provided to the second electrode 110 is finally provided to the pixel electrode 170 directly connected to the second connection pattern 155.

As described above, according to the embodiment of the present invention, since the channel region of the TFT is controlled by the thickness of the oxide semiconductor pattern 120 and the region caused by offset between the oxide semiconductor pattern 120 and the third electrode 130, the electrical characteristic of the TFT may be improved by independently controlling the above two elements.

The TFT described above may be so for all kind of a display device.

Figure 5D:
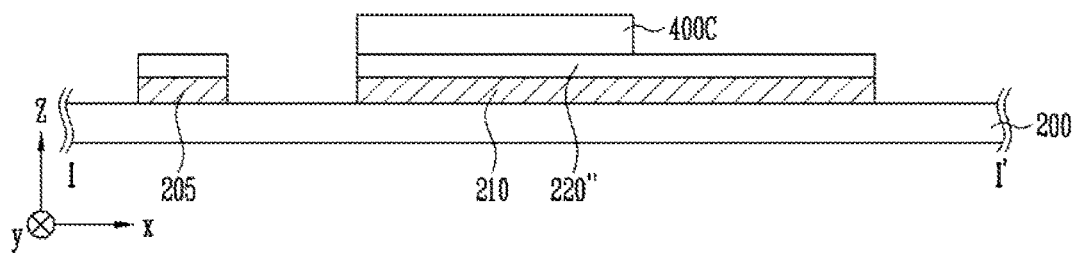
FIGS. 5A to 5O are cross-sectional views sequentially illustrating a method of manufacturing a TFT according to another embodiment of the present invention.
Figure 5E:
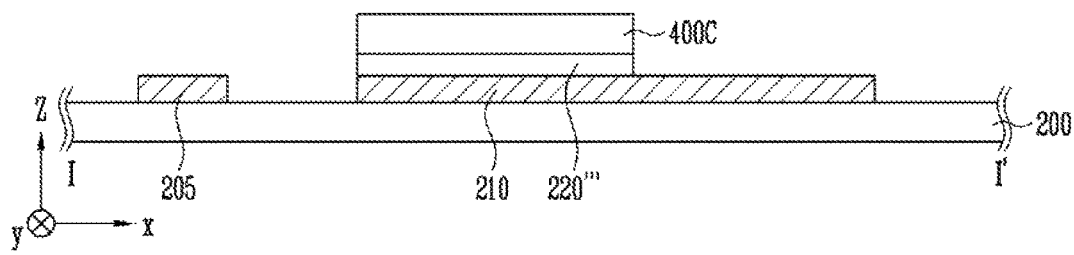
Figure 5F:
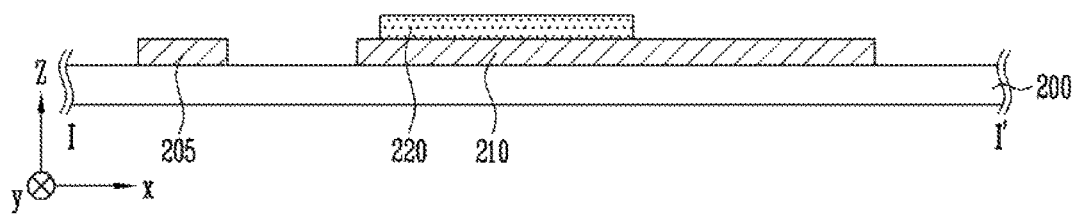
Figure 5G:
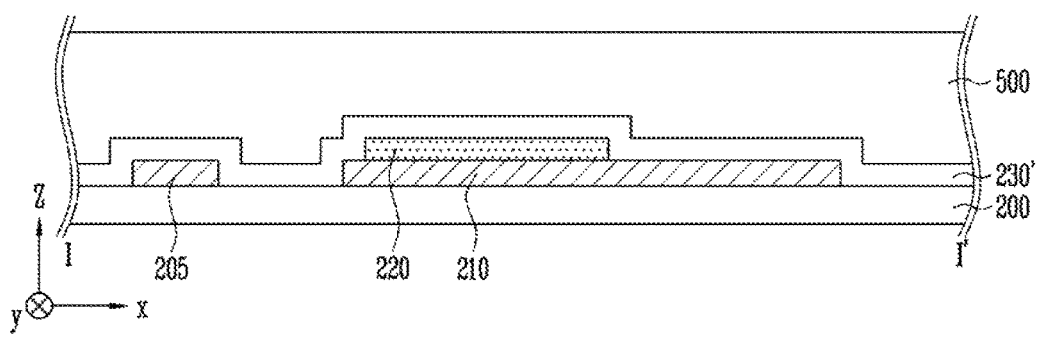
Figure 5H:
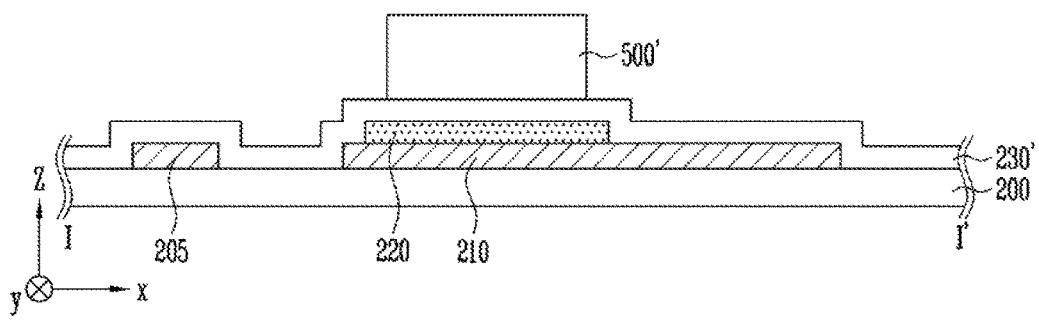
Figure 5I:
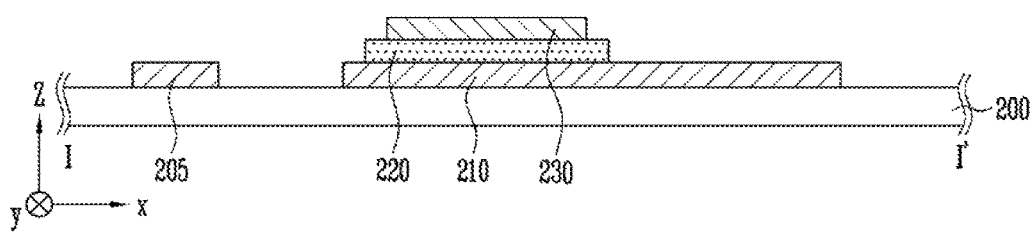
Figure 5J:
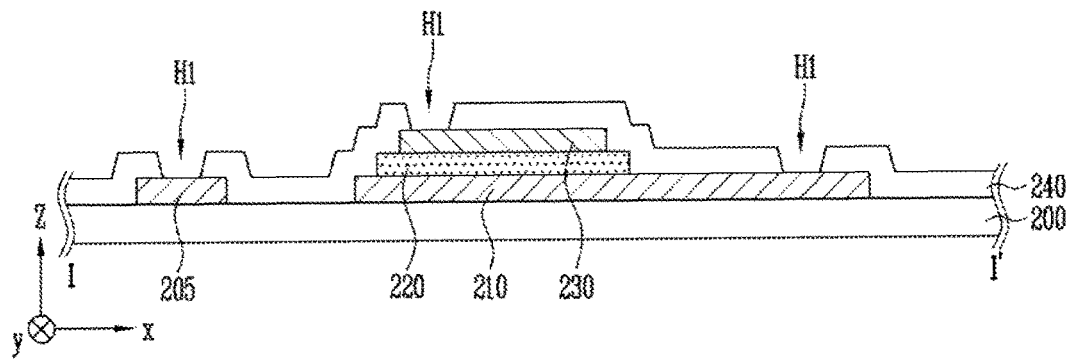
Figure 5K:
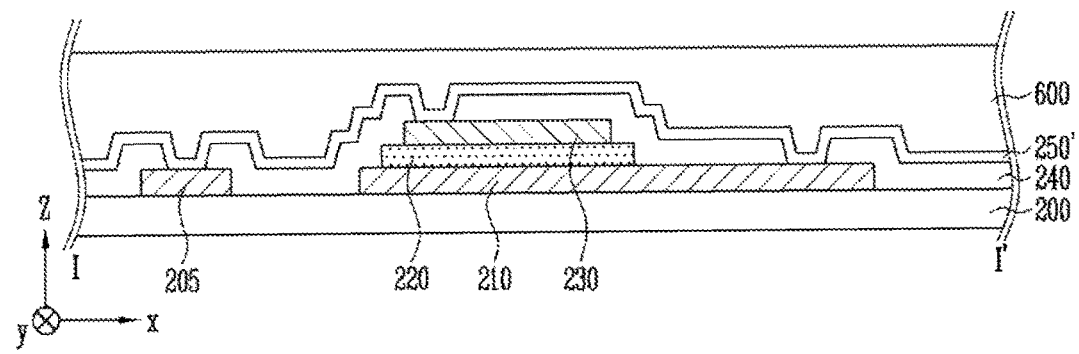
Figure 5L:
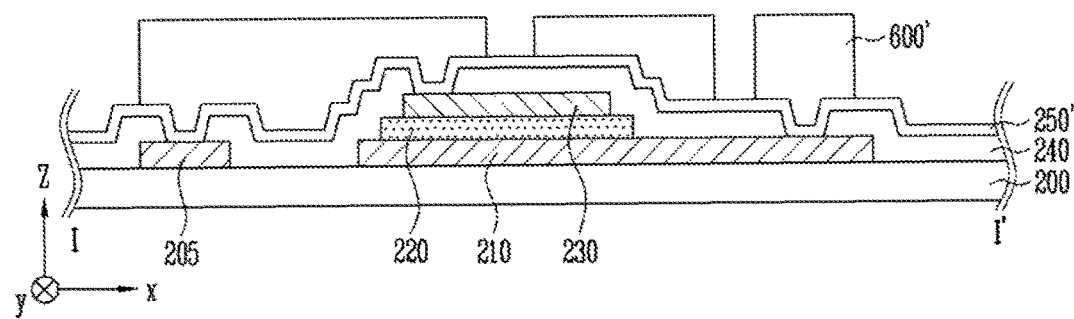
Figure 5M:
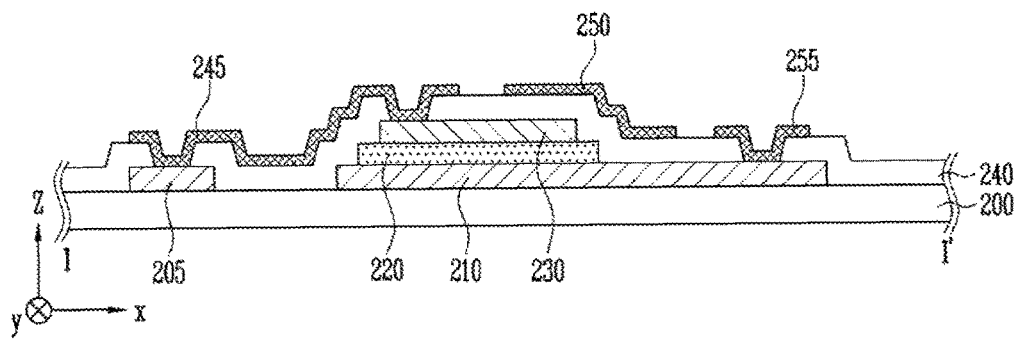
Figure 5N:
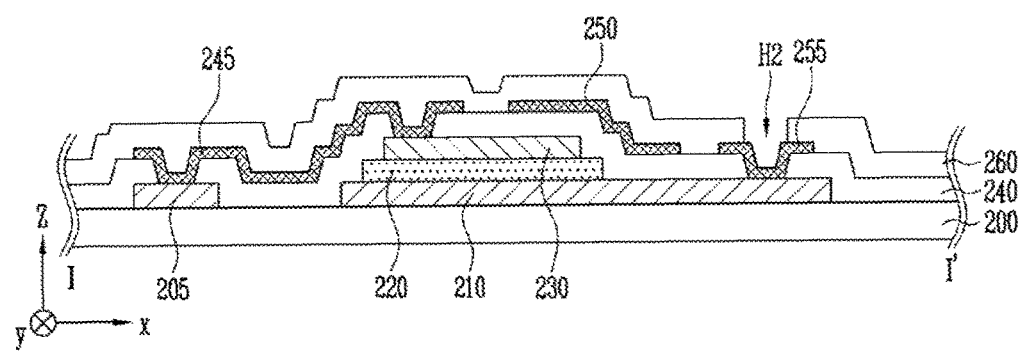
Figure 5O:
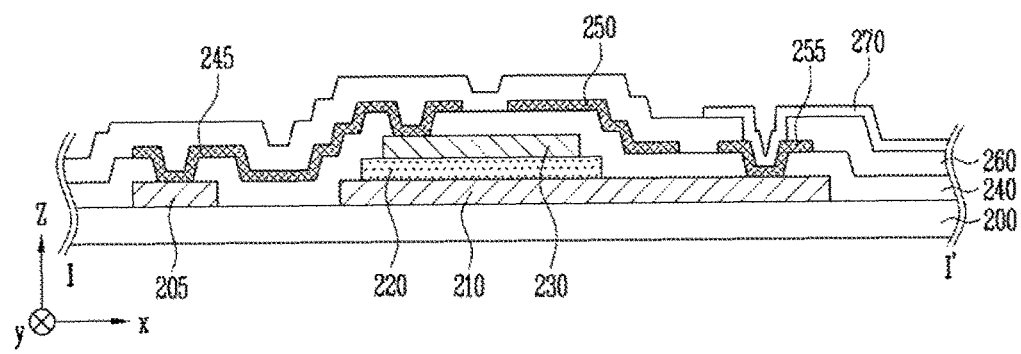

FIGS. 5A to 5O are cross-sectional views sequentially illustrating a method of manufacturing a TFT according to another embodiment of the present invention. Description of the elements the same as those of the above-described embodiment will not be given and description will be given based on differences.

Referring to FIG. 5A, a first conductive layer 210' and an oxide semiconductor material 220' are sequentially formed on a substrate 200. A first photoresist layer 400 is formed on the oxide semiconductor material 220'. After arranging a halftone mask 300 including a semi-transmitting unit A, a transmitting unit B, and a blocking unit C over the first photoresist layer 400, a mask process including a series of unit processes such as exposure is performed so that first and second photoresist layer patterns 400a and 400b having different thicknesses are formed as illustrated in FIG. 5B.

The first photoresist layer pattern 400a is formed to correspond to the semi-transmitting unit A of the halftone mask 300 and has a first thickness. The second photoresist layer pattern 400b is formed to correspond to the blocking unit C of the halftone mask 300 and has a second thickness larger than the first thickness.

In addition, on the substrate 200, the first photoresist layer 400 corresponding to the transmitting unit B of the halftone mask 300 is removed so that the oxide semiconductor material 220' positioned under the first photoresist layer 400 is exposed to the outside.

Referring to FIG. 5C, an etching process is performed on the first conductive layer 210' and the oxide semiconductor material 220' that are formed on the substrate 200 by using the first photoresist layer pattern 400a and the second photoresist layer pattern 400b as etching masks.

Due to the etching process, the first conductive layer 210' is patterned to a first electrode 205 and a second electrode 210 separated from the first electrode 205 by a uniform distance and the oxide semiconductor material 220' is patterned to a first oxide semiconductor material layer 220" positioned only in a region corresponding to the first photoresist layer pattern 400a and the second photoresist layer pattern 400b.

Referring to FIG. 5D, the first photoresist layer pattern 400a is removed by performing chemical processing such as etch back so that the first oxide semiconductor material layer 220" is exposed to the outside. At the same time, a third photoresist layer pattern 400c having a thickness smaller than that of the second photoresist layer pattern (400a of FIG. 5) arranged in a position in which the later described third electrode is to be formed is formed.

Referring to FIG. 5E, the first oxide semiconductor material layer 220" exposed to the outside is removed by performing a wet etching process by using the third photoresist layer pattern 400c as an etching mask so that the bar-shaped first electrode 205 and a part of the second electrode 210 are exposed to the outside. In addition, the third photoresist layer pattern 400c is removed through a strip process so that an oxide semiconductor pattern 220 is formed on the second electrode 210 as illustrated in FIG. 5F.

The second electrode 210 and the oxide semiconductor pattern 220 that form the TFT on the substrate 200 may be formed by one mask process.

Referring to FIG. 5G, a second conductive layer 230' is formed on the substrate 200 on which the oxide semiconductor pattern 220 is formed. A second photoresist layer 500 is formed on the second conductive layer 230'. After arranging a mask (not shown) over the second photoresist layer 500, a series of unit processes such as exposure are performed so that a photoresist layer pattern 500' is formed as illustrated in FIG. 5H. On the substrate 200, the photoresist layer pattern 500' is not formed in a part of the second conductive layer 230' so that the part of the second conductive layer 230' is exposed to the outside.

Referring to FIG. 5I, the second conductive layer 230' exposed to the outside is removed by using the photoresist layer pattern 500' as an etching mask so that a third electrode 230 that overlaps the oxide semiconductor pattern 220 is formed.

At this time, the second electrode 210, the oxide semiconductor pattern 220, and the third electrode 230 sequentially formed on the substrate have a step type stacked structure. The oxide semiconductor pattern 220 is positioned in the center and the second electrode 210 and the third electrode 230 are positioned under and on the oxide semiconductor pattern 220 so that the channel region longitudinal in a vertical direction is formed.

In addition, a current path is formed in a region caused by offset between side surfaces of the oxide semiconductor pattern 220 and the third electrode 230 having the step type stacked structure.

Referring to FIG. 5J, a first insulating layer 240 including a plurality of first contact holes H1 that expose a part of the first electrode 205, a part of the second electrode 210, and a part of the third electrode 230 to the outside is formed on the substrate 200 on which the third electrode 230 is formed.

Then, referring to FIG. 5K, a third conductive layer 250' is formed on the substrate 200 on which the first insulating layer 240 is formed. A third photoresist layer 600 is formed on an entire surface of the substrate 200 on which the third conductive layer 250' is formed.

After arranging a mask (not shown) over the third photoresist layer 600, a series of unit processes such as exposure are performed so that a photoresist layer pattern 600' is formed as illustrated in FIG. 5L. On the substrate 200, the photoresist layer pattern 600' is not formed in a part of the third conductive layer 250' so that the part of the third conductive layer 250' is exposed to the outside.

Referring to FIG. 5M, the third conductive layer 250' exposed to the outside is removed by using the photoresist layer pattern 600' as an etching mask so that a first connection pattern 245 for electrically connecting the first electrode 205 and the third electrode 230 through the first contact holes (H1 of FIG. 5J) and a gate electrode 250 positioned on a side of the oxide semiconductor pattern 220 is formed.

In addition, a second connection pattern 255 connected to a part of the second electrode 210 through the first contact hole H1 is formed on the first insulating layer 240.

The first connection pattern 245 transmits an electrical signal provided from the outside to the first electrode 205 to the third electrode 230. Therefore, the electrical signal transmitted to the third electrode 230 may be provided to the second electrode 210 formed under the oxide semiconductor pattern 220 due to the channel region of the oxide semiconductor pattern 220 formed under the third electrode 230.

Referring to FIG. 5N, a second insulating layer 260 including a second contact hole H2 that exposes a part of the second connection pattern 255 to the outside is formed on the substrate 200 on which the first and second connection patterns 245 and 255 and the gate electrode 250 are formed.

Continuously, referring to FIG. 5O, a pixel electrode 270 connected to the second connection pattern 255 through the second contact hole H2 is formed on the substrate 200 on which the second insulating layer 260 is formed.

By way of summation and review, since, in the vertical type TFT, the source and drain regions are to be covered in order to form a channel length, in an oxide semiconductor depositing process, with a change in taper angles of the source and drain regions, thickness uniformity deteriorates due to step difference so that the electrical characteristic of the TFT deteriorates.

In addition, since, in the vertical type TFT, the thickness of the oxide semiconductor determines the channel length, when a minimum channel region is to be secured for stability, a process margin is low.

In the TFT according to the present invention, the source electrode and the drain electrode are respectively formed under and on the oxide semiconductor pattern so that the vertical direction channel region is formed. Therefore, the channel region extends to the region caused by offset between the oxide semiconductor pattern and the drain electrode as well as the thickness of the oxide semiconductor pattern so that the electrical characteristic of the TFT may be improved.

In addition, since the channel region also extends to the region caused by offset, in the TFT, the minimum channel region required for stability may be secured so that 9 the process margin for the channel region may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor (TFT) comprising:
   a first electrode positioned on a substrate and a second electrode separated from the first electrode;
   an oxide semiconductor pattern positioned on the second electrode and including a channel region;
   a third electrode positioned on the oxide semiconductor pattern;
   a first insulating layer positioned on the substrate including the third electrode and including first contact holes exposing a part of the first electrode, a part of the second electrode, and a part of the third electrode;
   a gate electrode positioned on the first insulating layer and corresponding to a part of the oxide semiconductor pattern;
   a second insulating layer positioned on the substrate including the gate electrode and including a second contact hole corresponding to the first contact hole that exposes a part of the second electrode; and
   a pixel electrode positioned on the second insulating layer and electrically connected to the second electrode through one of the first contact holes and through the second contact hole,
   wherein the second electrode is positioned under the oxide semiconductor pattern and the third electrode is positioned on the oxide semiconductor pattern to form a stacked structure.

2. The TFT of claim 1, wherein the second electrode and the third electrode comprise different metal materials from each other.

3. The TFT of claim 1, wherein the oxide semiconductor pattern comprises indium-tin-zinc-oxide (ITZO).

4. The TFT of claim 1, further comprising a connection pattern positioned on the first insulating layer to electrically connect the first electrode and the third electrode through the first contact hole.

5. The TFT of claim 4, wherein the connection pattern comprises the same material as the gate electrode in the same layer as the gate electrode.

6. The TFT of claim 1, wherein the first electrode comprises the same material as the second electrode in the same layer as the second electrode.

7. A method of manufacturing a thin film transistor (TFT), the method comprising:
   forming a first electrode and a second electrode separated from the first electrode on a substrate;
   forming an oxide semiconductor pattern including a channel region on the second electrode;
   forming a third electrode that overlaps a part of the second electrode on the oxide semiconductor pattern;
   forming a first insulating layer including first contact holes exposing a part of the first electrode, a part of the second electrode, and a part of the third electrode on the substrate including the third electrode;
   forming a connection pattern for electrically connecting the first electrode and the third electrode through the first contact hole at the same time when a gate electrode corresponding to a part of the oxide semiconductor pattern is formed on the first insulating layer;
   forming a second insulating layer including a second contact hole corresponding to the first contact hole that exposes a part of the second electrode on the gate electrode; and
   forming a pixel electrode electrically connected to the second electrode through the first contact hole and the second contact hole on the second insulating layer, wherein the second electrode is positioned under the oxide semiconductor pattern and the third electrode is positioned on the oxide semiconductor pattern to form a stacked structure.

8. The method of claim 7, wherein the second electrode and the third electrode comprise different metal materials from each other.

9. The method of claim 7, wherein the channel region is determined by a region caused by offset between the third electrode and the oxide semiconductor pattern and a thickness of the oxide semiconductor pattern.

10. The method of claim 7, wherein the oxide semiconductor pattern comprises indium-tin-zinc-oxide (ITZO).

11. A method of manufacturing a thin film transistor (TFT), the method comprising:
subsequently forming a conductive layer and an oxide semiconductor layer on a substrate;
after depositing a photoresist layer on the oxide semiconductor layer, arranging a mask on the photoresist layer to form a first photoresist layer pattern and a second photoresist layer pattern thicker than the first photoresist layer pattern;
etching exposed parts of the oxide semiconductor layer and the conductive layer by using the first photoresist layer pattern and the second photoresist layer pattern as masks to form an oxide semiconductor pattern, a first electrode, and a second electrode separated from the first electrode by a uniform distance;
removing the first photoresist layer pattern to expose the oxide semiconductor pattern to the outside and forming the second photoresist layer pattern to a third photoresist layer pattern having a small thickness;
removing the exposed oxide semiconductor pattern and exposing the first electrode and the second electrode positioned under the oxide semiconductor pattern to the outside;
removing the third photoresist layer pattern and exposing the second electrode positioned under the third photoresist layer pattern and the oxide semiconductor pattern including a channel region to the outside;
forming a third electrode positioned on the oxide semiconductor pattern and overlapping a part of the second electrode;
forming a first insulating layer including first contact holes exposing a part of the first electrode, a part of the second electrode, and a part of the third electrode on the third electrode;
forming a connection pattern for electrically connecting the first electrode and the third electrode through the first contact hole at the same time when a gate electrode corresponding to a part of the oxide semiconductor pattern is formed on the first insulating layer;
forming a second insulating layer including a second contact hole corresponding to the first contact hole that exposes a part of the second electrode on the gate electrode; and
forming a pixel electrode electrically connected to the second electrode through the first contact hole and the second contact hole on the second insulating layer,
wherein the second electrode is positioned under the oxide semiconductor pattern and the third electrode is positioned on the oxide semiconductor pattern to form a stacked structure.

12. The method of claim 11, wherein the second electrode and the third electrode comprise different metal materials from each other.

13. The method of claim 11, wherein the channel region is determined by a region caused by offset between the third electrode and the oxide semiconductor pattern and a thickness of the oxide semiconductor pattern.

14. The method of claim 11, wherein the oxide semiconductor pattern comprises indium-tin-zinc-oxide (ITZO).

* * * * *